Figure 1:
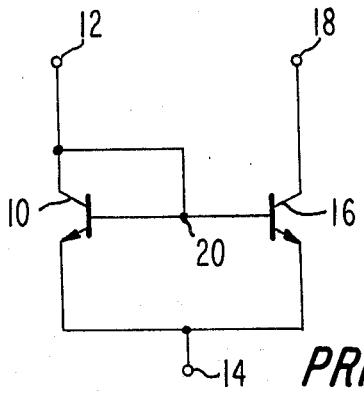
Fig. 1. PRIOR ART
Figure 4:
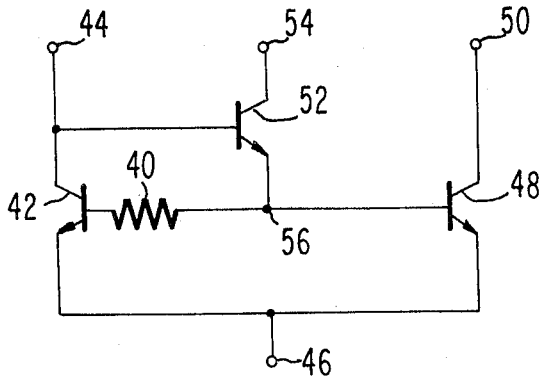
Figure 2:
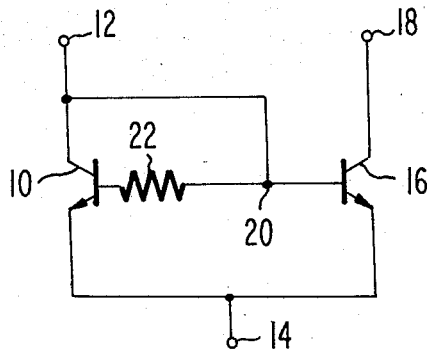
Figure 5:
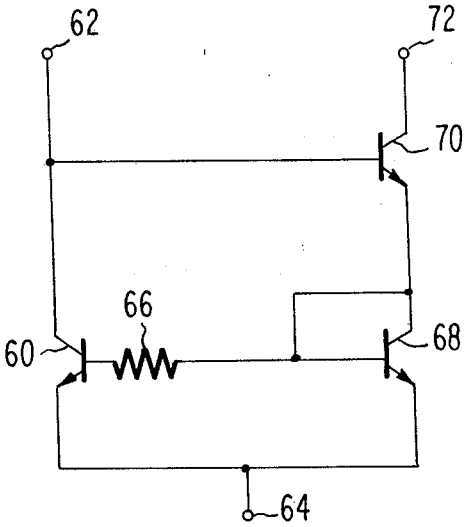
Figure 3:
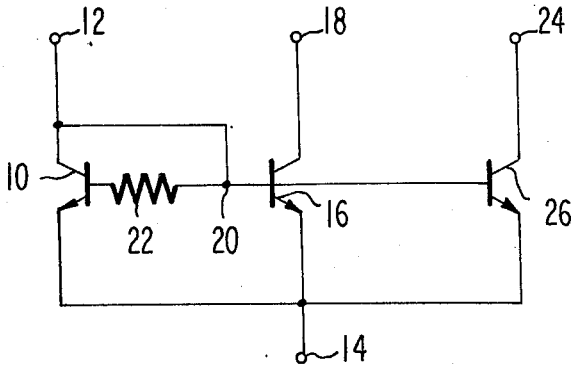

United States Defensive Publication [19] (H) [11] T953,012

Radovsky [43] Dec. 7, 1976

[54] CURRENT AMPLIFIER

[75] Inventor: Jonathan Samuel Radovsky, Trenton, N.J.

[73] Assignee: RCA Corporation

[21] Appl. No.: 639,405

[22] Filed: Dec. 10, 1975

[51] Int. Cl.[2] ..... H03F 3/04

[52] U.S. Cl. ..... 330/40; 323/4; 330/22

[57] ABSTRACT

In a current mirror amplifier (CMA) circuit the desired gain may not be realized because of the effects of the base currents of the transistors comprising the CMA. A resistance of appropriate value is added in series with the base of a transistor in the input path thereby varying the base-emitter junction voltage of an output current determining transistor in the CMA output path which in turn modifies this output current in a manner so as to reduce the effects of the base currents.

6 Claims, 1 Sheet Drawing,

10 Pages Specification

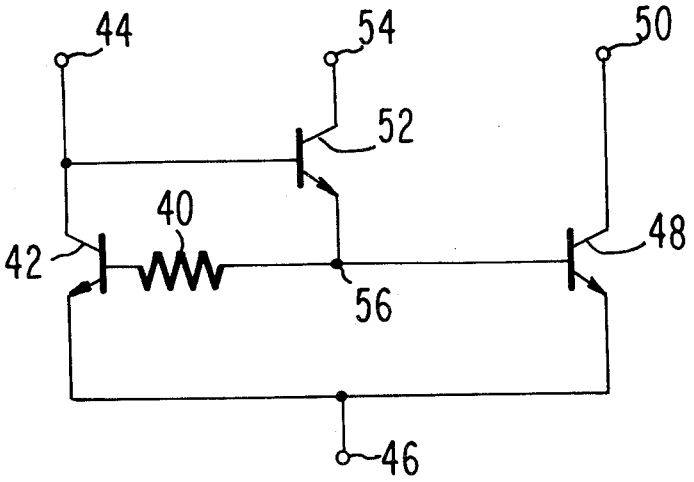

The file of this unexamined application may be inspected and copies thereof may be purchased (849 O.G. 1221, Apr. 9, 1968).